United States Patent [19]

Miranda

[11] Patent Number: 4,955,402
[45] Date of Patent: Sep. 11, 1990

[54] CONSTANT BATH SYSTEM WITH WEIR

[75] Inventor: Henry R. Miranda, Milpitas, Calif.

[73] Assignee: P.C.T. Systems, Inc., Milpitas, Calif.

[21] Appl. No.: 322,586

[22] Filed: Mar. 13, 1989

[51] Int. Cl.$^5$ .............................................. B08B 3/04
[52] U.S. Cl. ..................................... 134/107; 134/108;
  134/111; 134/183; 134/186; 134/195; 134/902
[58] Field of Search ................. 134/59, 105, 107, 108,
  134/111, 147, 154, 155, 182, 183, 186, 195;
  68/15, 181 R, 184, 208; 422/292, 300; 4/490,
  514, 541, 542, 543, 544; 137/263, 574

[56] References Cited

U.S. PATENT DOCUMENTS

| | | | |
|---|---|---|---|
| 990,442 | 4/1911 | Kibby | 4/514 |
| 1,739,695 | 12/1929 | Slauter | 134/105 X |
| 1,826,015 | 10/1931 | Morton | 134/111 |
| 1,932,827 | 10/1933 | Morris et al. | 134/111 X |
| 2,086,114 | 7/1937 | Bedford | 134/107 X |
| 2,109,089 | 2/1938 | Moyes | 4/514 |
| 2,374,535 | 4/1945 | Gibson | 134/105 |
| 2,713,347 | 7/1955 | Hazy | 134/186 X |
| 2,973,000 | 2/1961 | Pearson | 137/574 X |
| 3,033,712 | 5/1962 | Brevik | 134/182 X |
| 3,447,544 | 6/1969 | Vergara | 134/111 X |
| 4,135,530 | 1/1979 | Cheney | 134/182 X |
| 4,601,300 | 7/1986 | Sundheimer | 134/111 X |

FOREIGN PATENT DOCUMENTS 40452  1/1910  Fed. Rep. of Germany ........ 68/184

Primary Examiner—Philip R. Coe
Attorney, Agent, or Firm—Townsend and Townsend

[57] ABSTRACT

A rectangular container having a divider at one end of the container. The divider separates the container into a large processing region and a second region from which the solvent fluid is drained from the container. The divider acts as a weir over which the solvent flows from the processing region into the second region. Contaminating particles which fall onto the surface of the solvent and are momentarily trapped by surface tension are quickly removed from the processing region by the overflow action into the second region.

14 Claims, 3 Drawing Sheets

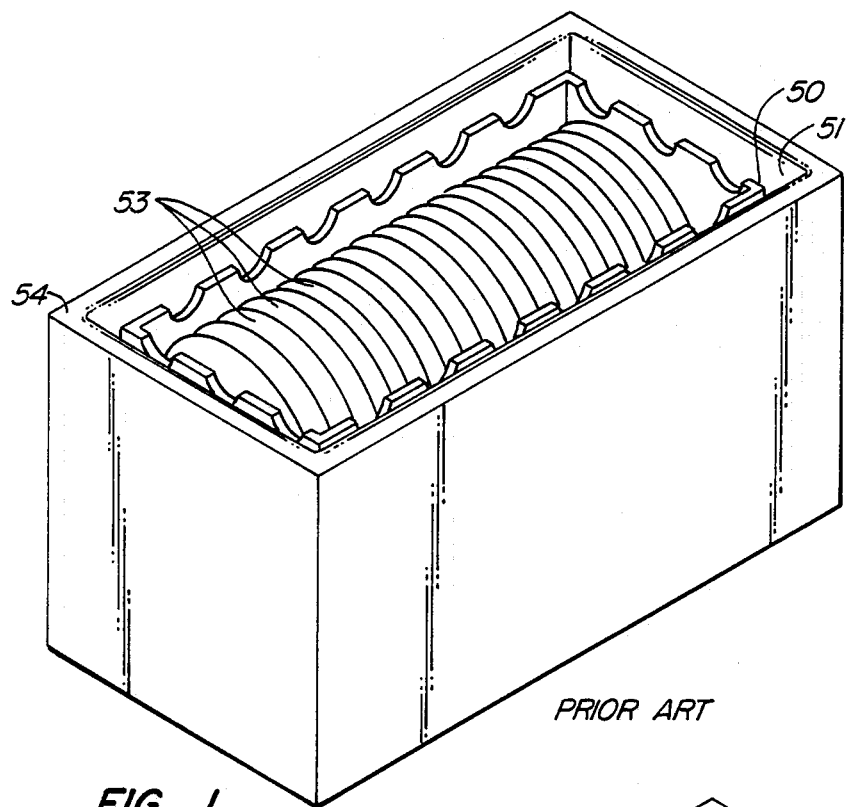
PRIOR ART
FIG._1.
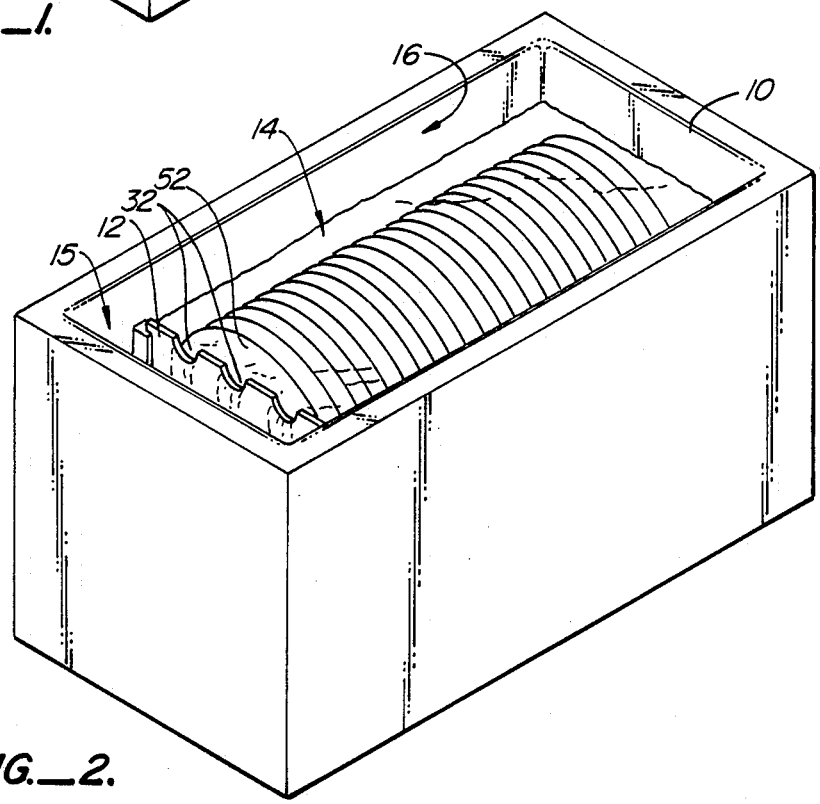
FIG._2.

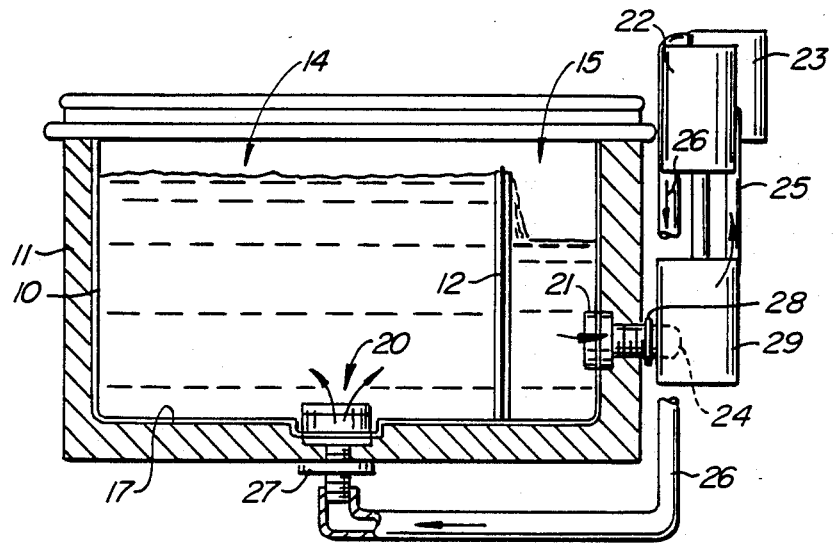
FIG._3A.
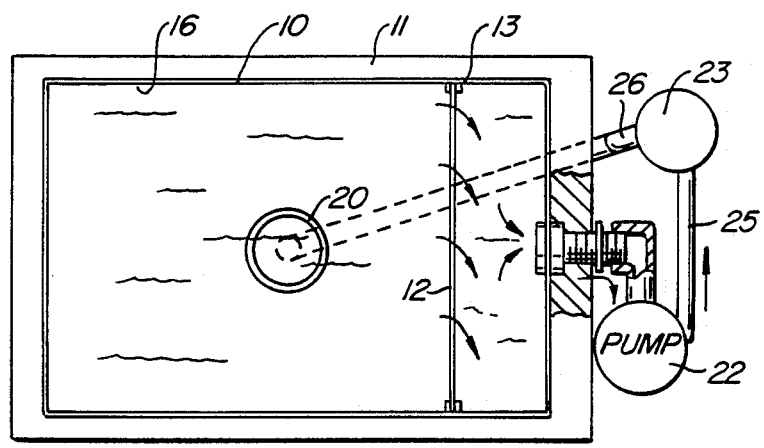
FIG._3B.

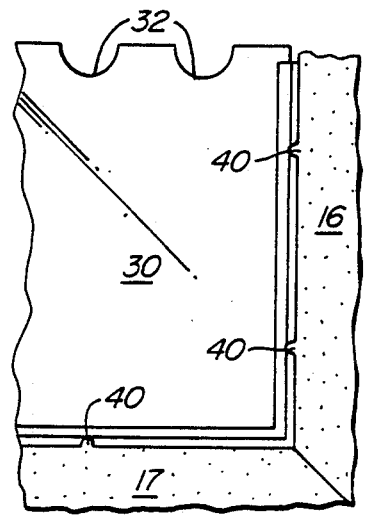
FIG._4.
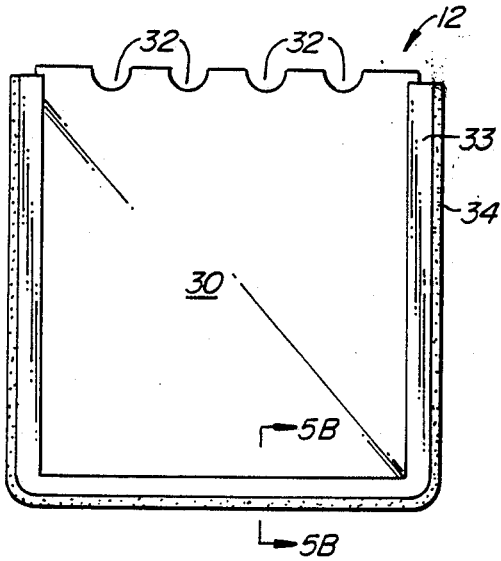
FIG._5A.
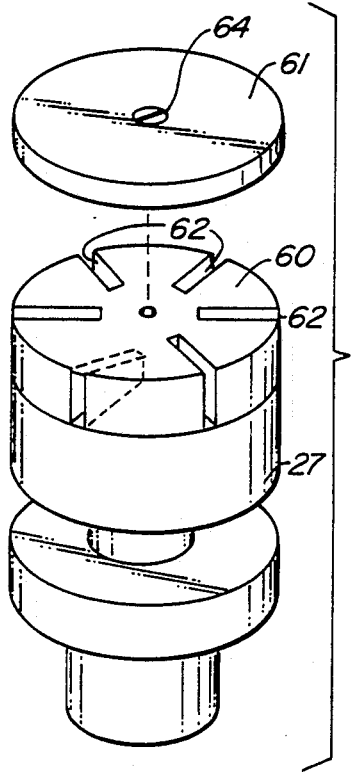
FIG._6A.
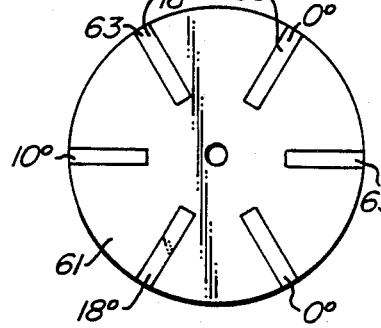
FIG._6C.
FIG._5B.
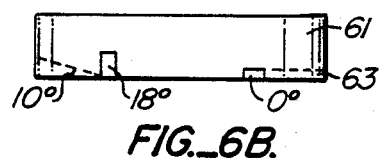
FIG._6B.

CONSTANT BATH SYSTEM WITH WEIR

FIELD OF THE INVENTION

This invention is related to the field of constant temperature baths and, more particularly, to filtered constant temperature baths for semiconductor manufacturing.

BACKGROUND OF THE INVENTION

Generally speaking, a constant temperature bath can be considered a tank of fluid maintained at a constant temperature into which a workpiece is placed for processing. In semiconductor device processing, the fluid is typically a solvent or an etchant, such as an acid, and the workpiece is a semiconductor wafer. In the bath, materials which have been deposited on the face of a semiconductor wafer are removed. A requirement for proper removal of these materials is that the solvent be maintained at a precise and proper temperature.

One type of constant bath system found in semiconductor processing is the standard constant temperature bath. The tank is an open rectangular quartz container. Heating strips are attached to the outside walls and bottom of the container so that the solvent is maintained at a proper temperature. The heating strips are typically controlled by a system with a thermocouple, thermal switch and, perhaps, even a microprocessor.

However, performance of standard bath systems is limited by the need to periodically replace the solvent. As wafers are processed in the solvent, the solvent becomes contaminated by unwanted particulates. This contamination affects the yield of "good" or functioning die from the wafers. Thus the solvent must be periodically dumped and replaced with a fresh, clean supply of solvent. This slows the processing of the semiconductor wafers. Most semiconductor fabrication areas have a number of standard bath systems in order to maintain wafer throughput as individual baths are refreshed.

Filtered constant bath systems are used for performance better than that offered by standard bath systems. In a filtered bath system, the solvent typically is pumped from the tank through a drain and passed through a filter to remove the unwanted particulate contaminants. The filtered solvent is then pumped back into the tank. The filtering system permits the bath to maintain the solvent not only at a constant temperature, but also in a constant "clean" condition. Filtered systems are normally much more expensive than standard bath systems.

A variation of the filtered bath system is the four-sided overflow, filtered bath system. In this system, the tank has two containers, one container placed within a second container. The inner container is completely filled and receives the semiconductor wafers for processing. As more solvent is pumped into the container, the solvent overflows the four sides of the inner container into the outer container. The outer container has a drain through which the solvent is removed, filtered and pumped back into the inner container.

Such four-sided overflow, filtered bath systems offer good protection against contamination. Particulates typically contaminate the solvent by falling onto the surface of the solvent. The four-sided overflow system allows the contaminating particulates to be removed from the inner container by the overflow action before the particulates can sink into the liquid. However, a disadvantage for this type of system is the expense due to the complexity of construction. Maintenance and repair are also more difficult compared to the simplicity of standard bath systems.

The present invention offers the performance of a four-sided overflow, filtered bath system at a much lower cost. The present invention reduces the complexity of construction of the four-sided overflow system for savings in maintenance and repair also.

Furthermore, the present invention is more efficient in space because it is made smaller than four-sided overflow filtered bath systems with its inner and outer containers. The present invention is also more efficient in chemical use since a smaller volume of solvent is required for the bath system. Finally, the present invention is more thermally efficient; only a small volume of solvent is heated and the heating occurs in the processing area where the heated solvent is required. These advantages are explained in detail below.

SUMMARY OF THE INVENTION

The present invention provides for a tank having a rectangular container with a removable divider at at least one end of the container. The divider separates the container into a large processing region and a second region from which the solvent fluid is drained from the container. The divider acts as a weir over which the solvent flows from the processing region into the second region. Contaminating particles which fall onto the surface of the solvent and are momentarily trapped by surface tension are quickly removed from the processing region by the overflow action into the second region.

This construction is much simpler than the four-sided, overflow constant bath system. Costs of construction, maintenance and repair are much lower. Yet the present invention has the performance advantages of a more complex four-sided, overflow constant bath system.

BRIEF DESCRIPTION OF THE DRAWINGS

A more detailed understanding of the present invention can be achieved by perusing the PREFERRED EMBODIMENTS OF THE PRESENT INVENTION and the following drawings:

FIG. 1 is a perspective view of the container and semiconductor wafers in a four-sided overflow, filtered bath system;

FIG. 2 is a perspective view of the tank of the present invention with a removable weir dividing container into two regions;

FIG. 3A is a side, cross-sectional view of the bath system for the tank shown in FIG. 1; FIG. 3B is a top view of the constant bath system of FIG. 2;

FIG. 4 is a detailed view of the edges of the removable weir against the sides of the container shown in FIG. 2;

FIG. 5A shows the removable weir in isolated detail; and FIG. 5B is a cross-sectional view of the edge of the removable weir.

FIG. 6A illustrates the inlet coupling with sparger head and plate for filtered liquid entering the main processing region of the container shown in FIG. 2; FIG. 6B is a side view of the sparger head and FIG. 6C is a bottom view of the sparger head.

PREFERRED EMBODIMENTS OF THE PRESENT INVENTION

FIG. 1 shows a perspective view of a tank for a four-sided overflow, filtered bath system. The tank has an inner quartz container 50 which is placed within an outer quartz container 51. The container 51 is protected by an insulating case 54. In operation the inner container 50 is filled with solvents, such as sulphuric acid, to etch various materials which have been formed on semiconductor wafers 53 or to etch the wafers themselves. The wafers 53 are arranged in a quartz "boat" and placed in the solvent within the container 50. After a specified time, the wafers 53 are removed for the next step in the semiconductor manufacturing process.

To maintain the purity of the solvent against undesired contaminants, the system pumps solvent fluid through an inlet port (not shown) into the inner container 50. As more solvent is pumped into the inner container 50, the solvent overflows the edges of the container 50 into the outer container 51. The inner container 50 has scalloped edges which increase the velocity of the solvent as it overflows. The solvent, which partially fills the outer container 51 during operation, is removed through an overflow port or drain in the container 51 (not shown), which feeds a pump. The pump then drives the solvent through a filter. The filtered solvent then is pumped back into the inner container 50 through the inlet. In operation, the four-sided overflow, filtered bath system cycles the solvent continuously to keep the amount of contaminating particulates down.

The solvent is maintained at a constant temperature by heating elements on the outer wall of the outer container 51.

A perspective view of the present invention is shown in FIG. 2. The present invention has a tank with a single rectangular container 10 which is divided into two regions 14 and 15 by a weir 12. The container 10, protected by an insulating case 11, has a volume of approximately 8 liters, the volume of a standard bath system. The main region 14 occupies most of the space of the container and receives semiconductor wafers 52 in a quartz boat for processing. The weir 12 extends across the container 10 to provide a seal along the sidewalls 16 and bottom 17 of the container 10. The weir 12 is located approximately one inch from one end of the container 10 to provide the second region 15, which acts as a drain region.

In operation, the present invention has a constant flow of solvent into the main processing region 14. As the liquid solvent fills the region 14, it overflows into the region 15 through the scalloped top edges 32 of the weir 12. The present invention has the operational advantage of the four-sided overflow, constant temperature bath system. Any contaminating particulate which drops upon the surface of the solvent in the main processing region 14 is typically held at the surface momentarily by surface tension. In the meantime, the overflow action sucks the top layer of the solvent into the drain region 15. The solvent in the region 15 is cleaned by filtering before being returned to the main region 14.

As shown in FIGS. 3A and 3B, the solvent liquid filling the second region 15 is removed through a drain 21 and drain coupling 28 through a drain tubing 24, which leads to a sump 29. The solvent in the sump 29 is driven by a pump 22. The pump 22 is typically a standard pump, such as pump No. PC 1/6 made by Filter Pump Industries of Glendale, California. The pump 22 by a tubing 25 drives the liquid through a filter 23. The filtered fluid then passes through a tubing 26 to an inlet coupling 27 and an inlet 20. The inlet 20 is located at the bottom of the container 10 in the main processing region 14.

The inlet 20 and the inlet coupling 27 are comparable to those used in previous filtered, constant temperature bath systems. However, the inlet 20 has a sparger plate 61 to match an inlet head 60, as shown in FIG. 6A. The inlet head 60 has six, circularly and symmetrically placed slots 61 though which the liquid is driven into the main region 14. The sparger plate 61 is circular with a screw 64 to hold the plate 61 to the top of the head 60. As illustrated in FIGS. 6B and 6C, the plate 61 has slots 63 which are aligned to the slots 62 in the head 60. The slots 63 are formed such that one of the slots 63 has a upward slant of 10 degrees from the center of the plate, the two slots on either side of the 10-degree slot have upward slants of 18 degrees from the center of the plate, the next slots have no slant (0 degrees) and the remaining slot helps block the flow of liquid from the corresponding slot 62 in the sparger head 60.

In operation the slots 62, 63 in the inlet head 60 and sparger plate 61 are oriented so that the blocked slot in the head 60 points directly at the weir 12 while the slot having a 10-degree slant points directly away from the weir 12.

The head 60 and sparger plate 61 serve to thoroughly mix the liquid in the main region 14. This action aids in the filtering of the liquid. Particulates which are already in the liquid have a chance of being swept over the weir 12 as the particulates are circulated throughout the main region 14. If liquid circulation is not complete throughout the main region 14, then the "dead spots" tend to accumulate particulates which may contaminate the wafers 52 which are placed into the liquid. The particular parameters found for the sparger plate 61 were found empirically for the particular dimensions and equipment used in a specific embodiment of the present invention. Different parameters and perhaps even different inlet assemblies must be used to obtain the maximum circulation of the liquid in the main processing region 14 for different embodiments of the present invention.

The weir 12, which separates the main region 14 from the overflow region 15 of the container 10, is removable for better filtering performance, ease of construction, repair and maintenance of the system. Despite the action of the solvent flow over the weir 12 for cleaning, particulates may still remain trapped in the main region 14 to contaminate the processed wafers. Rather than the tedious and time-consuming task of pouring out the solvent from the bath and replacing the solvent, the present invention allows the solvent to be filtered by merely removing the weir 12. The particulates are filtered from the solvent in the same manner as a standard filtered bath before the weir 12 is replaced for normal operation.

The weir 12 is a plate 30 cut from a sheet of quartz and shaped to closely fit across the container 10. Additionally the top edge of the plate 30 is shaped to form scalloped edges 32. To help form a good seal with the sides 16 and bottom 17 of the container 10, a resilient material 34 is attached around the side and bottom edges of the quartz plate 30. A good material is Goretex sealant. Goretex is a registered trademark of the W.L. Gore Company of Elkton, Md. Another sealant material is Calrez, manufactured by the Dupont company of Wilmington, Del.

The sealant material 34 in the form of a strip may be attached to the side and bottom edges of the sheet 30 by adhesives. However, a more desireable arrangement is illustrated in FIG. 5A and 5B. A frame strip 33 is used to attach the Goretex seal material to the sheet 30. The frame strip 33 has an H-shaped cross-section, i.e., two U-shaped channels arranged back-to-back. As shown in FIG. 5B, one channel receives the edge of the quartz sheet 30 so that the frame strip 33 is attached around the side and bottom of the quartz sheet 30. The sealant strip 34 is inserted into the second, outwardly facing U-shaped channel. The frame strip is made from extruded Teflon, a trademark of the DuPont Company, Wilmington, Del.

FIG. 4 shows how the removable weir 12 is held in place when it is inserted into the container 10. At the desired locations on each sidewall 16 and bottom 17 of the container 10, there are inward dimples 40 which engage each side of the weir 12. These dimples 40 are formed by spot heating the quartz container 10 at desired locations with a torch until the quartz is in molten state. Then a thin carbon rod is pressed into each desired location on the sidewalls 16 and bottom 17 of the quartz container 10. This technique has been found superior to welding quartz rods, which would act as retainers for the weir 12, to the sidewalls and bottom of the container 10.

Heating elements in the form of strips are placed along the sides and bottom of the main processing region 14 on the outside of the container 10. Thus, only the solvent in the processing region 14 is heated. This is a significant advantage over the four-sided overflow, constant temperature bath system in which the heating elements are placed on the outer container which receives the overflowing solvent. In that case the overflowing liquid is heated before being drained and removed to the pump. A typical solvent is sulphuric acid which has a considerable viscosity (like that of corn oil). The solvent is pumped at considerable pressure, approximately 40-50 lbs. per square inch. Thus, the heated acid tends to cause the pump to break down.

In the present invention, the solvent in the main processing region 14 is heated. The solvent then overflows into the drain region 15 before being pumped away. This allows the solvent to cool a few degrees (approximate 2 degrees Centigrade) before entering the pump. This lower temperature reduces wear on the pump and increases its longevity, thus reducing operating expenses.

Thus the present invention ideally provides for the removal of contaminating particulates from the solvent. The solvent in the region 15 is removed by the pump 22 and cleaned by the filter 23 before being returned to the main processing region 14 through the inlet 20. By the overflow of the solvent over the weir 12, the top layer of the solvent in the main processing region 14 is constantly removed as new fluid is pumped in from the bottom. Construction remains simple with only a single container required for the tank. The weir is removable, providing easy access to the container for maintenance, repair or filtering of obstinate particulates in the main processing region.

The present invention also provides for a system which occupies a space much less than that of a four-sided overflow, filtered bath system which has its space defined by the large outer container of the system. Furthermore, the present invention uses about 8 liters of solvent, while the typical, equivalent four-sided overflow system requires about 12 to 14 liters. Furthermore, the present invention is only required to heat 8 liters. The four-sided overflow system must heat 12 to 14 liters, thereby incurring the costs of additional heating elements and electricity compared to the present invention.

An alternative embodiment of the present invention is a bath system having a tank with a rectangular container with removable weirs at the two ends of the container. Such an arrangement increases the overflow action from the main processing region. Yet no great complexity is added, except to perhaps increase the overall length of the container. The advantages of the present invention still remain.

Thus, while the invention has been particularly shown and described with reference to the preferred embodiments, it is understood by those skilled in the art that changes in form and details may be made without departing from the spirit of this invention. It is therefore intended that an exclusive right be granted to the invention as limited only by the metes and bounds of the appended claims.

What is claimed is:

1. A system for bathing at least one object in a liquid at a constant temperature comprising:
   a rectangular container for holding said liquid, said container having an open top side;
   a removable dividing means comprises a flat plate having edges shaped for engaging the sides of said container and separating said container into first and second regions, said first region receiving said object in said liquid and said second region receiving said liquid from said first region, said dividing means having a scalloped top edge;
   means for removing said liquid from said second region and filling said first region with said removed liquid;
   means for filtering said removed liquid;
   means for heating said liquid to maintain said liquid at a constant temperature;
   whereby said liquid overflows said dividing means top edge from said first region into said second region when said system is in operation.

2. The system as in claim 1 further comprising a resilient material attached to said flat plate edges for sealing said first region from said second region.

3. The system as in claim 2 further comprising a framing bracket between said flat plate edges and said resilient material.

4. A tank for a constant temperature, semiconductor wafer bath system comprising:
   a rectangular container holding a liquid, said container having an open top side;
   a removable dividing means for separating said container into at least first and second regions, said first region receiving semiconductor wafers in said liquid and said second region receiving said liquid from said first region, comprising first and second flat plates having edges shaped to engage the sides of said container, said first flat plate located at a first end of said container and said second flat plate located at a second end of said container so that said container is separated into said first region between said first and second flat plates and said second region having two parts, a part at each end of said container, said dividing means having a top edge;

heating means for heating said liquid in the container;

outlet means in said second region for removing said liquid from said second region; and inlet means in said first region for filling said first region with said removed liquid;

whereby said liquid overflows the top edge of said dividing means from said first region into said second region when said system is in operation.

5. A tank for a constant temperature, semiconductor wafer bath system comprising:

a rectangular container holding a liquid, said container having an open top side;

a removable dividing means for separating said container into at least first and second regions, the dividing means comprising a flat plate having edges shaped to engage the side of said container, said flat plate having a resilient material attached to said flat plate edges for sealing said first region from said second region, said first region receiving semiconductor wafers in said liquid and said second region receiving said liquid from said first region, said dividing means having a top edge;

heating means for heating the liquid in the container;

outlet means in said second region for removing said liquid from said second region; and inlet means in said first region for filling said first region with said removed liquid;

said tank further comprising a framing bracket between said flat plate edges and said resilient material, said framing bracket having an H-shaped cross-section for receiving said flat plate edges at a first open end and said resilient material at a second open end;

whereby said liquid overflows the top edge of the dividing means from said first region into said second region when said system is in operation.

6. A tank for a constant temperature, semiconductor wafer bath system comprising:

a rectangular container holding a liquid, said container having an open top side;

a removable dividing means comprising a flat plate having edges shaped to engage the sides of said container for separating said container into at least first and second regions, said first region receiving semiconductor wafers in said liquid and said second region receiving said liquid from said first region, said dividing means having a top edge;

heating means for heating the liquid in the container;

outlet means in said second region for removing said liquid from said second region;

inlet in said first region for filling said first region with said removable liquid; and said container having inwardly protruding dimples for engagably locating said flat plate to separate said container into said first and second regions;

whereby said liquid overflows the top edge of the dividing means from said first region into said second region when said system is in operation.

7. The tank as in claim 6 wherein said dimples locates said flat plate approximately one inch from one end of said container.

8. A tank for a constant temperature, semiconductor wafer bath system comprising:

a rectangular container holding a liquid, said container having an open top side;

a dividing means for separating said container into at least first and second regions, said first region receiving semiconductor wafers in said liquid and said second region receiving said liquid from said first region, said dividing means having a top edge;

heating means for heating the liquid in the container, the heating means further comprising elements for heating only said first region of said container;

outlet means in said region for removing said liquid from said second region; and inlet means in said first region for filling said first region with said removed liquid;

whereby said liquid overflows the top edge of the dividing means from said first region into said second region when said system is in operation.

9. The tank as in claim 8 wherein said heating elements are attached to the outside of said container.

10. A system for bathing at least one object in a liquid at a constant temperature comprising:

a rectangular container for holding said liquid, said container having an open top side;

removable dividing means separating said container into first and second regions, said dividing means comprising first and second flat plates having edges shaped to engage the sides of said container, said first plate located at a first end of said container and said second plate located at a second end of said container so that said container is separated into said first region between said first and said second plates, and said second region having two parts, a part at each end of said container, said first region receiving said object in said liquid and said second region receiving said liquid from said first region, said dividing means having scalloped top edges;

means for removing said liquid from said second region and filling said first region with said removed liquid;

means for filtering said removed liquid;

means for heating said liquid to maintain said liquid at a constant temperature;

whereby said liquid overflows the top edges of said dividing means from said first region into said second region once the system is in operation.

11. A system for bathing at least one object in a liquid at a constant temperature comprising:

a rectangular container for holding said liquid, said container having an open top side;

a removable dividing means comprising a flat plate having edges shaped to engage the side of said container, separating said container into first and second regions, a resilient material being attached to said flat plates edges for sealing said first region from said second region, said first region receiving said object in said liquid and said second region receiving said liquid from said first region, said dividing means having a scalloped top edge;

means for removing said liquid from said second region and filling said first region with said removed liquid;

means for filtering said removed liquid;

means for heating said liquid to maintain said liquid at a constant temperature;

a framing bracket means between said flat plate edges and said resilient material, said framing bracket having an H-shaped cross-section for receiving said flat plate edges at a first open end and said resilient material at a second open end;

whereby said liquid overflows the top edges of said dividing means from said first region into said second region when said system is in operation.

12. A system for bathing at least one object in a liquid at a constant temperature comprising:
   a rectangular container for holding said liquid, said container having an open top side;
   a removable dividing means comprising a flat plate having edges shaped to engage the sides of said container, separating said container into first and second regions, said first region receiving said object in said liquid and said second region receiving said liquid from said first region, said dividing means having a scalloped top edge;
   means for removing said liquid from said second region and filling said first region with said removed liquid;
   means for filtering said liquid;
   means for heating said liquid to maintain said liquid at a constant temperature; and
   wherein said container has inwardly protruding dimples for engagably locating said flat plate to separate said container into said first and second regions;
   whereby said liquid overflows the top edges of said dividing means from said first region into said second region when said system is in operation.

13. The system as in claim 12 wherein said dimples locate said flat plate approximately one inch from one end of said container.

14. The system as in claim 13 wherein said heating means comprises heating elements for only said first region of said container.

* * * * *